US008731722B2

(12) United States Patent
Magato et al.

(10) Patent No.: US 8,731,722 B2
(45) Date of Patent: May 20, 2014

(54) INTEGRATED SIMULATION TECHNOLOGY

(75) Inventors: William A. Magato, Milford, OH (US); Brian John Resnick, Cincinnati, OH (US)

(73) Assignee: Intelligrated Headquarters LLC, Mason, OH (US)

( * ) Notice: Subject to any disclaimer, the term of this patent is extended or adjusted under 35 U.S.C. 154(b) by 328 days.

(21) Appl. No.: 13/179,195

(22) Filed: Jul. 8, 2011

(65) Prior Publication Data

US 2013/0013114 A1    Jan. 10, 2013

(51) Int. Cl.
*G05B 15/00*   (2006.01)
*G06G 7/48*   (2006.01)

(52) U.S. Cl.
USPC .............................. 700/275; 700/230; 703/7

(58) Field of Classification Search
USPC ........... 700/99, 100, 108, 109, 110, 213, 228, 700/230, 275; 703/6, 7; 702/182
See application file for complete search history.

(56) References Cited

U.S. PATENT DOCUMENTS

| | | | | |
|---|---|---|---|---|
| 4,512,747 | A * | 4/1985 | Hitchens et al. | 434/428 |
| 5,724,489 | A * | 3/1998 | Yamamoto et al. | 700/245 |
| 6,157,864 | A * | 12/2000 | Schwenke et al. | 700/79 |
| 6,766,285 | B1 | 7/2004 | Allen, Jr. et al. | |
| 7,151,972 | B2 | 12/2006 | Denton et al. | |
| 7,272,451 | B2 | 9/2007 | Duemler | |
| 7,349,751 | B2 | 3/2008 | Denton et al. | |
| 7,590,942 | B2 | 9/2009 | Phillips et al. | |
| 7,653,451 | B2 | 1/2010 | Denton et al. | |
| 7,676,294 | B2 * | 3/2010 | Baier et al. | 700/108 |
| 7,707,126 | B2 | 4/2010 | Klein et al. | |
| 7,715,936 | B2 * | 5/2010 | Thierauf | 700/99 |
| 7,974,725 | B2 | 7/2011 | Gu et al. | |
| 8,612,050 | B2 * | 12/2013 | Lee et al. | 700/223 |
| 2005/0154623 | A1 | 7/2005 | Grienitz | |
| 2006/0167587 | A1 * | 7/2006 | Read | 700/245 |
| 2007/0100478 | A1 | 5/2007 | Egeland et al. | |
| 2007/0208439 | A1 | 9/2007 | Driskill et al. | |
| 2008/0077266 | A1 * | 3/2008 | Thierauf | 700/99 |
| 2008/0126054 | A1 * | 5/2008 | Cohen | 703/13 |
| 2008/0208374 | A1 | 8/2008 | Grgic et al. | |
| 2009/0088875 | A1 * | 4/2009 | Baier et al. | 700/83 |
| 2010/0030373 | A1 * | 2/2010 | Lee et al. | 700/223 |
| 2010/0222899 | A1 * | 9/2010 | Blevins et al. | 700/80 |
| 2010/0222910 | A1 * | 9/2010 | Thierauf | 700/101 |
| 2011/0295563 | A1 * | 12/2011 | McDaniel | 703/1 |
| 2012/0253756 | A1 * | 10/2012 | Favier | 703/2 |

FOREIGN PATENT DOCUMENTS

| | | |
|---|---|---|
| EP | 0 660 210 | 6/1995 |
| JP | 4 248636 | 9/1992 |
| WO | WO 02/079885 | 10/2002 |
| WO | WO 2010/116491 | 10/2010 |

OTHER PUBLICATIONS

International Search Report and Written Opinion dated Dec. 5, 2012 for Application No. PCT/US2012/045737.
English Abstract of Japanese publication No. JP 4 248636.

* cited by examiner

*Primary Examiner* — Charles Kasenge
(74) *Attorney, Agent, or Firm* — Frost Brown Todd LLC

(57) ABSTRACT

Virtual material handling systems can be used to drive the operation of real material handling systems for purposes such as testing and validation of the components of the real material handling systems. The real material handling system, in turn, can provide data regarding system operation which may be fed back to the virtual material handling system to control its function.

12 Claims, 2 Drawing Sheets

INTEGRATED SIMULATION TECHNOLOGY

BACKGROUND

Modern high speed material handling systems are very complex, comprising numerous subsystems and sophisticated controls. When new material handling systems are initially installed, or existing systems retrofitted, they are tested as part of the commissioning process before the systems are approved as being "business ready". Such testing typically involves physically loading objects on the conveyors and operating the system while observing its actual performance.

Physical testing of material handling systems represents a significant portion of the total engineering effort and cost of an installation and has inherent limitations. Physical testing is very labor intensive, requiring the constant and consistent introduction of cartons onto conveyors at appropriate locations of the system. The cartons used for testing must meet the project specifications of conveyable products, and are preferably loaded into the system to replicate a wide range of carton circumstances, including the replication of carton size and gap sequences which are known to be problematic for material handling systems. All subsystems of the complete material handling system are not installed at the same time, so physical testing cannot be done until the complete system is installed and operational. Physical testing is intended to find issues with the system as installed. However, buyer observations of carton control issues, such as jams and crashes, can lead to customer frustration, dissatisfaction and anxiety.

SUMMARY

The present invention may reduce the amount of actual physical testing required by combining virtual testing with the physical material handling system. Within the teachings of the present invention, virtual cartons may be modeled and emulated as though they have been actually placed into the physical system, such that the actual control logic physically controls the material handling system as though cartons were actually present. This allows testing of the operation of the control logic while the control logic is actually controlling the material handling system hardware. It allows the hardware to be tested without cartons actually in the system. There are no physical jams or crashes for the customers to observe.

BRIEF DESCRIPTION OF THE DRAWINGS

The drawings and detailed description which follow are intended to be merely illustrative and are not intended to limit the scope of the invention as contemplated by the inventor.

DETAILED DESCRIPTION

The inventors have conceived of novel technology which, for the purpose of illustration, is disclosed herein as applied to the context of installation of material handling systems (e.g., conveyors, sortation systems, merge systems, and similar systems, as well as combinations of such systems). While the application of the inventors' technology in the context of installation of material handling systems satisfies a long-felt but unmet need in that field, it should be understood that the disclosure of the inventors' technology in that context should not be treated as implying limitations on potential fields where aspects of the inventors' technology can be beneficially applied. Accordingly, the disclosure set forth herein should be understood as being illustrative only, and not limiting.

Figure 1:
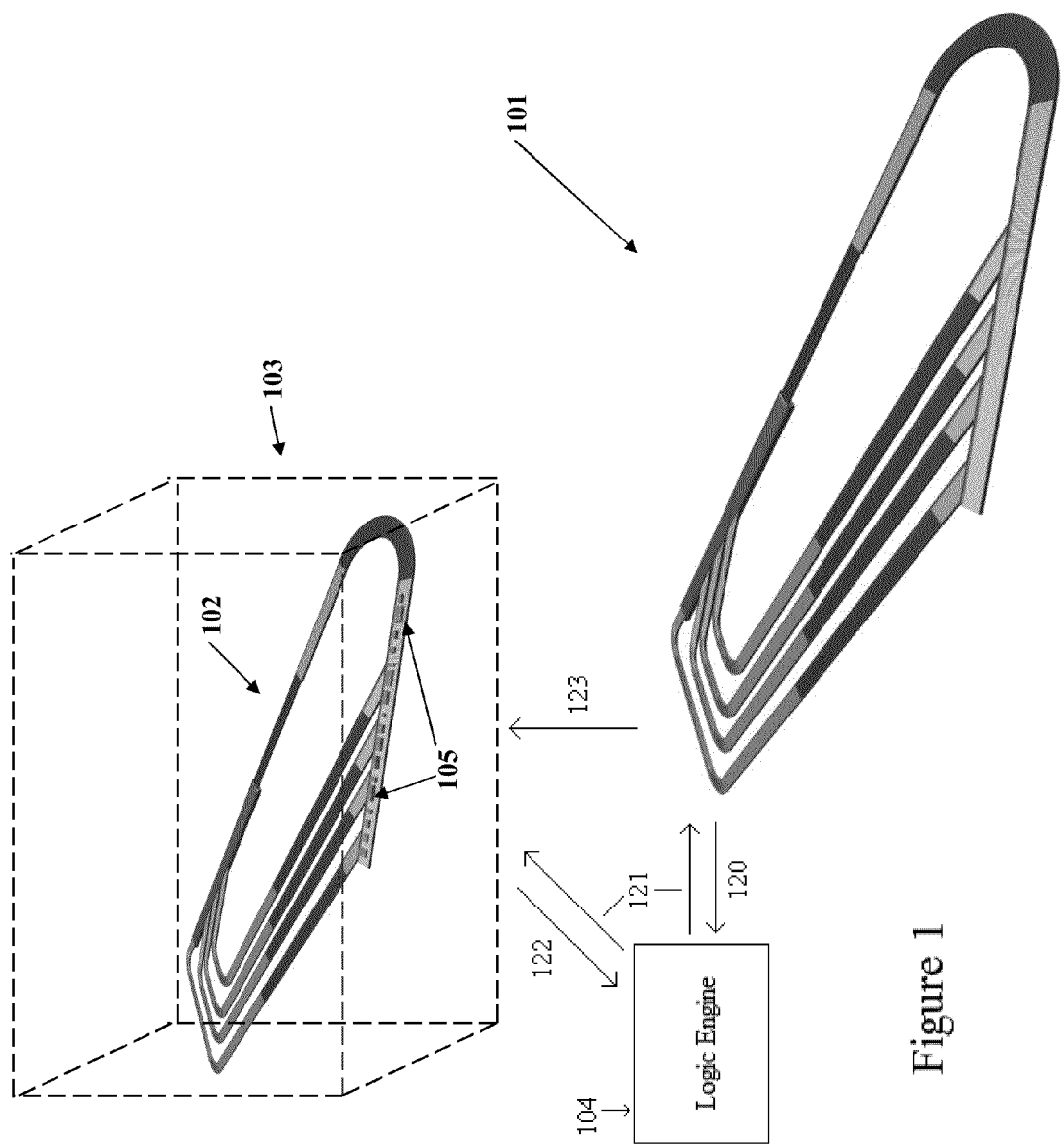
FIG. 1 depicts a configuration comprising a real conveyor, and equivalent virtual conveyor, and a logic engine.

Turning now to the figures, FIG. 1 depicts a configuration in which a real material handling system [101] is modeled using a virtual material handling system [102] operating in a simulation environment [103] capable of determining how objects would move on the real material handling system [101] when it is operating in production. FIG. 1 also illustrates a logic engine [104]. The logic engine [104] is a component which would take outputs from a material handling system (which, as described herein, could be a real material handling system [101], a virtual material handling system [102], or some combination of real and virtual systems) and would respond with commands that the material handling system would use to route objects. For example, in a production environment, the real material handling system [101] could send data to the logic engine [104] in an outgoing communication [120]. This data could be information such as signals showing that a photoeye has detected an object, that a section of conveyor is running at a certain speed, that a bar code has been scanned, etc. The logic engine [104] could then respond by sending a command stream [121] to the real material handling system [101]. The command stream [121] could include commands such as commands to fire a divert, speed up or slow down a portion of conveyor, etc. The real material handling system [101] would then implement the commands (e.g., by firing a divert, or speeding up or slowing down a portion of conveyor), which would have the effect of causing objects being transported by the real material handling system [101] to be routed to their destinations.

In a configuration such as shown in FIG. 1, the logic engine [104] would not necessarily be aware of the source of its inputs, or of what system(s) or device(s) are operating to implement its commands. As a result, the configuration of FIG. 1 could be used to observe what would be likely to happen in a production environment without actually requiring the operation of the real material handling system [104]. This could take place by, instead of sending the outgoing communication [120] from the real material handling system [101] to the logic engine [104], sending a set of virtual signals [122] from the virtual material handling system [102] to the logic engine [104]. The logic engine [104] could then respond by sending the command stream [121] to the virtual material handling system [102], where it would trigger actions in the simulation environment [103] that would be equivalent to the actions that would take place in the real world if the commands were implemented by the real material handling system [101].

In addition to (or as an alternative to) allowing operation of real and virtual material handling systems [101][102] in a manner which is transparent to the logic engine [104], a configuration such as shown in FIG. 1 could also allow some aspects of testing of the real material handling system [101] to be tied to the operation of the virtual material handling system [102]. This could take place by sending virtual signals [122] from the virtual material handling system [102] to the logic engine [104] as described above, but, instead of sending the resulting command stream [121] only to the virtual material handling system [102], the command stream [121] could be sent to both the virtual material handling system [102] and the real material handling system [101]. This would cause the components of the real material handling system [101] to operate as if they were routing real objects corresponding to virtual objects [105] in the virtual material handling system [102], without the necessity of actually loading, unloading, transporting, etc, any type of real object. The operation of the real material handling system [101] could then be compared with the operation of the virtual material handling system [102] to determine if any of the components which had been used in implementing the real material handling system [101] needed adjustment, replacement, or some other type of attention (e.g., because they were not operating at all, or because they were not operating according to the specifications used as the basis for the virtual material handling system [102]).

A comparison between the operation of the real and virtual material handling systems [101][102] could be achieved in a variety of ways, such as placing sensors on the real material handling system [101] which would report the state of the various components of that system to an analysis module (not shown in FIG. 1) which would compare them to the state of the virtual components in the virtual material handling system [102]. Such state comparison could also be measured based on signals generated by the components of the real material handling system [101] themselves, rather than by separate sensors (e.g., a signal from a solenoid which says that the solenoid has fired successfully, or a signal from a motor saying that it is operating). Similarly, in some cases, the operation of the real and virtual material handling systems [101][102] could be compared visually, such as by looking at a display of the operation of the virtual material handling system [102] on a computer screen (not shown) and comparing it with the actual operation of the real material handling system [101] (e.g., to see if a divert fires in the virtual system, but fails to do so in the real system). Of course, in some circumstances, a display could illustrate a problem even without a comparison between the real and virtual material handling systems. For example, if the operation of the virtual material handling system [102] was causing collisions or other types of problems with the handling of objects on the virtual material handling system [102], that could be made apparent on the display, even if the real and virtual material handling systems [101][102] were operating identically (this could also be made manifest in other ways, such as using a collision detection module in the simulation environment [103] to detect collisions and provide a collision warning in the case where a collision is detected). Various combinations of, and alternatives to, these comparison approaches could be implemented depending on the data available in a particular system, and so the comparisons described above should be understood as being illustrative only, and not limiting.

In addition to combining the operation of the real and virtual material handling systems [101][102] by operating the real material handling system [101] based on commands generated from data from the virtual material handling system [102], it is also possible that the real and virtual material handling systems [101][102] in a configuration such as shown in FIG. 1 could be combined by running the virtual material handling system [102] based on operation data [123] from the real material handling system [101]. For example, in some implementations, a real material handling system [101] might be implemented with encoders (not shown in FIG. 1) which could measure the speed of the various sections of the conveyors in the real material handling system [101]. The outputs of these encoders could then be communicated as operation data [123] to the virtual material handling system [102], and the virtual material handling system [102] could then operate based on the operation data [123] rather than on the (usually idealized) specifications for the components. For example, rather than simulating the movement of the virtual objects [105] running on an idealized conveyor (whose parameters would generally be specified for the virtual material handling system by some type of configuration file or interface), the virtual material handling system [102] could simulate the movement of the virtual objects [105] running on a virtual conveyor which was running at the actual speed of the conveyor of the real material handling system [101] (as measured by sensors on the real material handling system [101]). Similar feedback could be provided for other types of components, such as by sending operation data [123] which indicates whether real a divert fires, rather than (or in addition to) sending information on conveyor speed.

Figure 2:
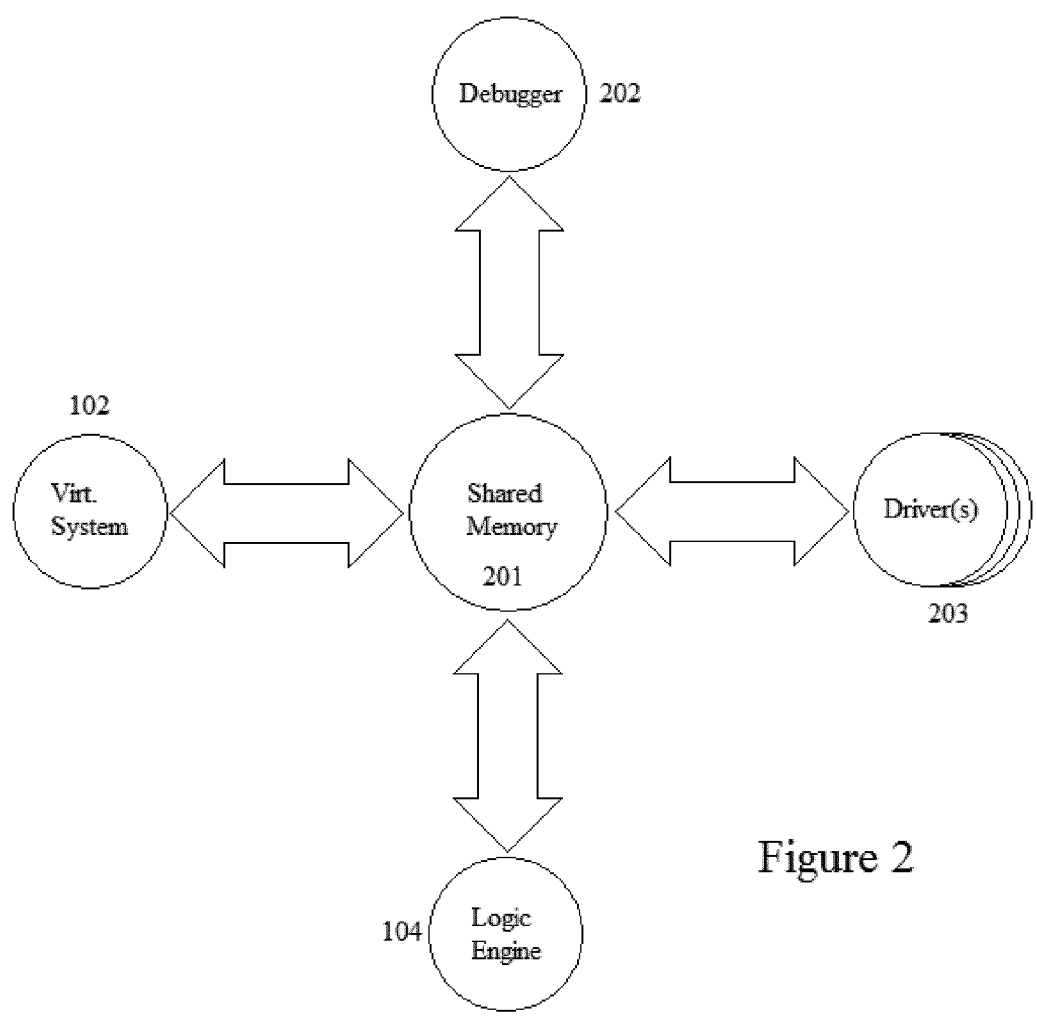
FIG. 2 depicts how various components may communicate through a shared memory.

It should be understood that, while the configuration of FIG. 1 illustrates the simulation environment [103] and the logic engine [104] as separate components, the technology set forth herein is not limited to being implemented with those components operating on separate machines, and, in some cases, the technology disclosed herein could be used to implement a system where components such as the virtual material handling system [102] and the logic engine [104] are implemented to operate on a single physical device. For example, as shown in FIG. 2, it is possible that the virtual material handling system [102] and the logic engine [104] would communicate with one another through a shared memory space [201]. In such a case, the virtual material handling system [102] and the logic engine [104] could be implemented as different threads running as part of a single process (or different processes running on a single computer), communicating through a shared memory space [201] allocated by the underlying computer's operating system.

Further, as shown in FIG. 2, such shared memory communication could include additional processes beyond those corresponding to the virtual material handling system [102] and the logic engine [104] discussed above. For example, FIG. 2 indicates that the shared memory space [201] might also be used by one or more drivers [203]. In such a configuration, the driver(s) could correspond to physical devices from the real material handling system [101] which could generate outputs (e.g., photoeyes, which would generate edge detection outputs) and/or respond to inputs (e.g., diverts, which would fire in response to commands from the logic engine [104]). As is known to those of ordinary skill in the art, different physical devices will often have different input and output parameters. For example, one physical device might generate output in which the first bit of an 8 bit output word indicates whether the device is ready to fire, while another physical device might generate output in which the same information would be communicated as the third bit of a 16 bit output word. The driver(s) [203] could be used to convert the specific output produced by a physical device into a standard form that would be fed into the logic engine [104] so that new devices could be accommodated by changing the drivers [203], rather than requiring modification to the logic engine [104] itself. The same approach could be taken with the logic engine's ouput—with the drivers [203] being used to convert standard outputs produced by the logic engine [104] into specific command formats that would be processed by the particular physical devices in the real material handling system [101].

Another example of an additional process which could use shared memory communication such as illustrated in FIG. 2 is a debugger [202]. Such a debugger [202] could be used to force inputs to (or outputs from) the logic engine [104] to take particular values for testing and/or (naturally) debugging purposes. For instance, in order to test that various lamps on the real material handling system [101] are functioning, the debugger [202] could be used to replace the appropriate bits in the command stream from the logic engine [104] with bits indicating that the lamps should be turned on, so that the lamps would be actuated for testing purposes regardless of whether they would normally be acutated according to the algorithms of the logic engine [104]. Examples of code which could be used to organize communication between the various processes (virtual material handling system [102], logic engine [104], debugger [202] and drivers [203]) are provided in tables 1 and 2, discussed below.

TABLE 1

Exemplary code for synchronizing output bits in a shared memory.

```
const bool *Driver_io::refresh_outbits( )
{
    outbit_lock.fast_lock( );
    for(unsigned int i = 0; i < outbit_size; i++)
    {
        outbit_engine_cached[i] = outbit_engine_shared[i];
        outbit_dmask_cached[i] = outbit_dmask_shared[i];
        outbit_debug_cached[i] = outbit_debug_shared[i];
    }
    outbit_lock.fast_unlock( );
    for(unsigned int i = 0; i < outbit_size; i++)
    {
        for(unsigned int j = 0; j < 8; j++)
        {
            unsigned int k ((i * 8) + j);
            uint8_t mask = (1 << j);
            outbits[k] = (outbit_dmask_cached[i] & mask)
                ? ((outbit_debug_cached[i] & mask) != 0)
                : ((outbit_engine_cached[i] & mask) != 0);
        }
    }
    return outbits;
}
```

TABLE 2

Exemplary code for synchronizing input bits in a shared memory.

```
const bool *Engine_io::refresh_inbits( )
{
    inbit_lock.fast_lock( );
    for(unsigned int i = 0; i < inbit_size; i++)
    {
        inbit_driver_cached[i] = inbit_driver_shared[i];
        inbit_emask_cached[i] = inbit_emask_shared[i];
        inbit_emulate_cached[i] = inbit_emulate_shared[i];
        inbit_dmask_cached[i] = inbit_dmask_shared[i];
        inbit_debug_cached[i] = inbit_debug_shared[i];
    }
    inbit_lock.fast_unlock( );
    for(unsigned int i = 0; i < inbit_size; i++)
    {
        for(unsigned int j = 0; j < 8; j++)
        {
            unsigned int k = ((i * 8) + j);
            uint8_t mask = (1 << j);
            if(inbit_dmask_cached[i] & mask)
            {
                inbits[k] = ((inbit_debut_cached[i] & mask) != 0);
            }
            else if(inbit_emask_cached[i] & mask)
            {
                inbits[k] = ((inbit_emulate_cached[i] & mask) != 0);
            }
            else
            {
                inbits[k] = ((inbit_driver_cached[i] & mask) != 0);
            }
        }
    }
    return inbits;
}
```

In those tables, table 1 shows code which could be used by a driver [203] to read commands from a logic engine [104] which had been added to a shared memory [201] (the array outbit_engine_shared), values from a debugger [202] which could override the commands from the logic engine (the array outbit_debug_shared), and a masking array specifying which command values from the logic engine should be overridden by values form the debugger (the array outbit_dmask_shared). Once these values had been read into the private memory of the driver (copied into the various cached arrayes by the first for loop), they could then be written on a bit by bit basis to the outbits array (as shown in the nested for loops) which would eventually be translated to the appropriate form for a particular physical device (code for this function would vary from device to device, and is not shown) and used to control the real material handling system [101].

Table 2 shows a similar process being performed for the inputs to a logic engine [104]. Initially, the code of table 2 makes copies of the input values provided by the drivers [202] and the virtual machine control system [102], as well as masking and debug arrays showing whether the input values should ultimately be based on the data from the drivers [203], the virtual material handling system [102], or the debugger [202] (this is accomplished by the first for loop in table 2). The code of table 2 would then populate the inbits array using logic similar to that discussed in the context of table 1 (this performed in the nested for loops of table 2). However, rather than deciding between two values as shown in the code of table 1, the code of table 2 populates the inbits array using values from three sources—the debugger [202], the virtual material handling system [102], and the drivers [203]. Notes that the order of conditionals in the if/else block in table 2 will have the effect of allowing the debugger to override values from the virtual material handling system, and the virtual material handling system to override values from the drivers, depending on the state of the dmask and emask arrays.

Of course, other approaches than those shown in tables 1 and 2 could be used to allow shared memory communication between components. For example, in some cases, rather than having different arrays which different components would modify (e.g., the debug and dmask arrays for the debugger, the emask and emulate arrays for the virtual material handling system), there might only be a single input array and a single output array in the shared memory, and that array might be jointly modified by any of the components shown in FIG. 2. In such a case, the different components in FIG. 2 might have an order in which they operate (e.g., first the device drivers add information, then the emulator, then the debugger) so that, regardless of the fact that any of the components could modify the shared arrays, the arrays that any one of the components would ultimately read would always be the same deterministic mix of data. Other approaches, such as having different components call one another (e.g., in the case where the components are implemented as threads operating in a single process space) are also possible, and could be easily implemented by one of ordinary skill in the art in light of this disclosure. Accordingly, the discussion of approaches to communicating through shared memory space should be understood as being illustrative only, and not limiting.

As another example of a variation on possible implementations of the inventors' technology, it should be understood that, in some cases, there might not be a shared memory, and so other types of communication entirely would have to be used. For example, consider a situation where the logic engine [104] is implemented in a PLC (programmable logic controller), while the virtual material handling system [102] is part of a simulation environment [103] running on a PC (personal computer). In this case, rather than using masks and shared memory, it is more likely that the data that the PLC would use to generate commands will be determined by which component (either the PC providing the virtual material handling system [102] or the real material handling system [101]) has its outputs hooked up to the inputs of the PLC (note that, in this case, either the PLC would likely be programmed to accept inputs directly in the format provided by the real material handling system [101] or the drivers would likely be applied to both the real material handling system [101] and the virtual material handling system [102], since otherwise switching input connections would not only switch the data source, it would also change the data format).

It is also possible that combined approaches could be implemented (e.g., where inputs to the PLC are determined by actual wiring, while whether a virtual material handling system [102] is controlled by operation data [123] from the real material handling system [101] is based on data in a memory shared by the drivers for the real material handling system [101] and the virtual material handling system [102]). Of course, while these different communication approaches could impact details of how the inventors' technology would be implemented, the functionality provided by the technology itself is not limited to any particular communication infrastructure, and so the discussion of particular components in the contexts of particular communication infrastructures should be understood as being illustrative only, and not limiting.

While the above discussion focused on implementations in which the operation of real and virtual material handling systems are coordinated, it should be understood that the disclosure set forth herein is not limited to being implemented in the manners explicitly described. For example, the techniques applied herein could be used in implementations which include multiple logic engines (e.g., one generating commands for gap optimization, one generating commands for merging, etc), which include different communication paths than described (e.g., rather than sending information to a shared memory, information, such as information about the operation of a device, could be sent from one component to another in series). Other variations are also contemplated by the inventors and will be immediately apparent to one of ordinary skill in the art in light of this disclosure. Accordingly, instead of limiting the protection accorded by this document, or by any document which is related to this document, to the material explicitly disclosed herein, the protection should be understood to be defined by the following claims, which are drafted to reflect the scope of protection sought by the inventors in this document when the terms in those claims which are listed below under the label "Explicit Definitions" are given the explicit definitions set forth therein, and the remaining terms are given their broadest reasonable interpretation as shown by a general purpose dictionary. To the extent that the interpretation which would be given to the claims based on the above disclosure is in any way narrower than the interpretation which would be given based on the "Explicit Definitions" and the broadest reasonable interpretation as provided by a general purpose dictionary, the interpretation provided by the "Explicit Definitions" and broadest reasonable interpretation as provided by a general purpose dictionary shall control, and the inconsistent usage of terms in the specification or priority documents shall have no effect.

EXPLICIT DEFINITIONS

"Based on" means that something is determined at least in part by the thing that it is indicated as being "based on." When something is completely determined by a thing, it will be described as being "based EXCLUSIVELY on" the thing.

"Computer Executable Instructions" means data which can be used to specify physical or logical operations which can be performed by a computer.

"Computer readable medium" means any object, substance, or combination of objects or substances, capable of storing data or instructions in a form in which they can be retrieved and/or processed by a device. A computer readable medium should not be limited to any particular type or organization, and should be understood to include distributed and decentralized systems however they are physically or logically disposed, as well as storage objects of systems which are located in a defined and/or circumscribed physical and/or logical space. Computer memory such as hard discs, read only memory, random access memory, solid state memory elements, optical discs and registers is an example of a "computer readable medium."

"Configured" means that the thing "configured" is adapted, designed or modified for a specific purpose. An example of "configuring" in the context of computers is to provide a computer with specific data (which may include instructions) which can be used in performing the specific acts the computer is being "configured" to do. For example, installing Microsoft WORD on a computer "configures" that computer to function as a word processor, which it does by using the instructions for Microsoft WORD in combination with other inputs, such as an operating system, and various peripherals (e.g., a keyboard, monitor, etc).

"Controller" means a component, which could be implemented using a PLC, a PC, or other type of device, which generates commands for a material handling system. The logic engines described herein are examples of "controllers."

"Encoder" means a type of sensor which detects and reports movement of a surface of a material handling system which interfaces with an object (if being transported by the material handling system).

"Equivalent" means, when used to compare a real material handling system with a virtual material handling system, that the real material handling system has components which are intended correspond with simulated components in the virtual material handling system (though the correspondence may not be achieved, due to defective components, improper installation, or other reasons).

"Material Handling System" means devices which are used to move objects (generally cartons or totes, but potentially also other objects such as articles not in containers) from one location to another. "Material handling systems" can include merges, diverts, conveyors, and gappers, as well as larger systems made up of combinations of those components. As used in the claims, a "Material Handling System" does not include centralized control algorithms which issue commands to the components of the system, though it can include the components which respond to those commands (e.g., smart photoeyes, diverts, etc).

"Set" means a number, group, or combination of zero or more things of similar nature, design, or function.

"Subset" means a set which does not include any elements which are not also members of the set that the subset is indicated as being a subset of.

Accordingly, we claim:

1. A machine comprising:
   a. a real material handling system, the real material handling system comprising a plurality of sensors operable to provide data regarding operation of the real material handling system;
   b. a computer, the computer configured to:
      1. simulate a virtual material handling system operating with one or more virtual objects, wherein each of the one or more virtual objects is a simulated carton, wherein operating with one or more virtual objects comprises moving the one or more virtual objects from one location to another, wherein the virtual material handling system is equivalent to the real material handling system;
2. generate data regarding the simulated operation of the virtual material handling system, wherein the data regarding simulated operation of the virtual material handling system comprises a signal indication detection of a bar code associated with a simulated carton;
3. provide a logic engine configured to receive data regarding operation of one or more material handling systems taken from the group of material handling systems consisting of:
   i. the real material handling system; and
   ii. the virtual material handling system;
   and, based on that data, generate one or more commands;
4. provide the one or more commands generated by the logic engine to the real material handling system and the virtual material handling system, wherein the one or more commands comprises a command for routing the simulated carton associated with the detected bar code to a destination;
5. provide a subset of the data regarding operation of the real material handling system to the virtual material handling system;
6. modify the simulated operation of the virtual material handling system to match the operation of the real material handling system as indicated by the subset of the data regarding operation of the real material handling system; and
7. identify a problem in operation of the real material handling system when the real material handling system and the virtual material handling system are operating identically based on detecting a problem in handling of the one or more virtual objects.

2. The machine of claim 1, wherein the logic engine is configured to receive data regarding operation of the one or more material handling systems using a shared memory.

3. The machine of claim 1 wherein the subset of data regarding operation of the real material handling system comprises data indicating a speed of a conveyor in the real material handling system.

4. The machine of claim 1, wherein detecting the problem in handling of the one or more virtual objects comprises one or more elements selected from the group consisting of:
   a. detecting a collision of two or more virtual objects; and
   b. detecting a jam of one or more virtual objects.

5. The machine of claim 1, wherein the one or more virtual objects comprises a plurality of simulated cartons having a carton size and gap sequence previously identified as problematic.

6. The machine of claim 5, wherein the one or more commands comprises commands to optimize gaps between the plurality of simulated cartons.

7. A method comprising:
a. operating a virtual material handling system with one or more virtual objects, wherein each of the one or more virtual objects is a simulated carton, and wherein the virtual material handling system is equivalent to a real material handling system, and wherein operating the virtual material handling system with one or more object comprises moving the one or more virtual objects from one location to another;
b. sending data regarding operation of the virtual material handling system to a controller, wherein the data regarding operation of the virtual material handling system comprises a signal indicating detection of a bar code associated with a simulated carton;
c. based on the data regarding operation of the virtual material handling system, generating a set of commands, wherein the set of commands comprises a command for routing the simulated carton associated with the detected bar code to a destination;
d. providing the commands to the virtual material handling system and the real material handling system;
e. operating the virtual material handling system and the real material handling system in accordance with the commands;
f. modifying the operation of the virtual material handling system to match a set of data regarding operation of the real material handling system; and
g. identifying a problem in operation of the real material handling system, wherein the problem is identified when the real material handling system and the virtual material handling system are operating identically, and wherein the problem is identified based on detecting a problem in handling of the one or more virtual objects.

8. The method of claim 7, wherein sending data regarding operation of the virtual material handling system to the controller is performed using a shared memory.

9. The method of claim 7, wherein:
a) the set of data regarding operation of the real material handling system comprises data indicating speed for a conveyor in the real material handling system; and
b) modifying the operation of the virtual material handling system to match the set of data comprises setting the speed for a virtual conveyor corresponding to the conveyor in the real material handling system to match the speed from the data regarding operation of the real material handling system.

10. The method of claim 7, wherein detecting the problem in handling of the one or more virtual objects comprises one or more elements selected from the group consisting of:
a. detecting a collision of two or more virtual objects; and
b. detecting a jam of one or more virtual objects.

11. The method of claim 7, wherein the one or more virtual objects comprises a plurality of simulated cartons introduced with a carton size and gap sequence previously identified as problematic.

12. The method of claim 11, wherein the set of commands comprises commands to optimize gaps between the plurality of simulated cartons.

* * * * *